(12) United States Patent
Yang

(10) Patent No.: US 6,707,732 B2
(45) Date of Patent: Mar. 16, 2004

(54) METHOD OF QUICKLY DETERMINING WORK LINE FAILURE TYPE

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/222,320

(22) Filed: Aug. 16, 2002

(65) Prior Publication Data

US 2003/0185063 A1 Oct. 2, 2003

(30) Foreign Application Priority Data

Mar. 26, 2002 (TW) .................................. 91105949 A

(51) Int. Cl.$^7$ ................................................ G11C 7/00
(52) U.S. Cl. ........................................ 365/200; 365/201
(58) Field of Search ................................ 365/200, 201; 714/721

(56) References Cited

U.S. PATENT DOCUMENTS 5,265,055 A * 11/1993 Horiguchi et al. .......... 365/200
5,659,550 A * 8/1997 Mehrotra et al. ........... 714/721

* cited by examiner

*Primary Examiner*—Huan Hoang
(74) *Attorney, Agent, or Firm*—Ladas & Parry

(57) ABSTRACT

A method of determining word line failure types in a memory device. In the method of the present invention, a relational table of electric characteristic and defective word line failure types is formed. A defective word line is then activated. Next, a first voltage is applied to the defective word line and the electric characteristic of the defective word line is measured. Finally, the defective word line failure type is determined according to the measured electric characteristic of the defective word line and the relational table.

11 Claims, 4 Drawing Sheets

METHOD OF QUICKLY DETERMINING WORK LINE FAILURE TYPE

BACKGROUND OF THE INVENTION

1. Field of the Invention

The present invention relates in general to a method of quickly determining word line defect type in dynamic random access memory.

2. Description of the Related Art

Conventionally, defective word lines in memory, produced in the conventional DRAM process, may have small leakage currents such that the memory may not work correctly. Typically, there are several failure types of defective word lines that cause leakage current in the memory due to process defect. Types of defective word lines include a word line shorting to a bit line, a word line shorting to a word line and a word line shorting to the substrate due to pin holes in the gate oxide layer between the word line and the substrate.

Conventional methods to determine defective word line failure type perform an electric characteristic analysis to determine which word lines are defective. A physics analysis is then performed to determine defective word line failure types. The physics analysis repeatedly removes the surface of the memory by chemical solution and then checks the removed memory by an electron microscope. However, the physics analysis is time consuming and sometimes cannot determine the defective word line failure types.

SUMMARY OF THE INVENTION

An object of the present invention is to provide a method to quickly determine defective word line failure types. The method of the present invention quickly determines the defective word line failure type by performing an electric characteristic analysis.

In the embodiment of the present invention, a relational table of electric characteristic and defective word line failure types is formed. A defective word line is then activated, a first voltage is applied to the defective word line and the electric characteristic of the defective word line is measured simultaneously. Next, the defective word line failure type is determined according to the relational table and the measured electric characteristic.

In the second embodiment of the present invention, a relational table of electric characteristic and defective word line failure types is formed. A defective word line is activated, a second voltage is applied to a word line and the current on the word line is measured simultaneously. Next, it is determined whether the word line is defective according to the measured current, and the next step is carried out if the word line is a defective word line. Thereafter, a third voltage is applied on the defective word line, and the electric characteristic of the defective word line is measured. Next, the defective word line failure type is determined according to the measured electric characteristic and the relational table, and the defective word line is turned off. Next, another word line of the memory device is activated and the same processes are performed again.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

First Embodiment

Figure 1:
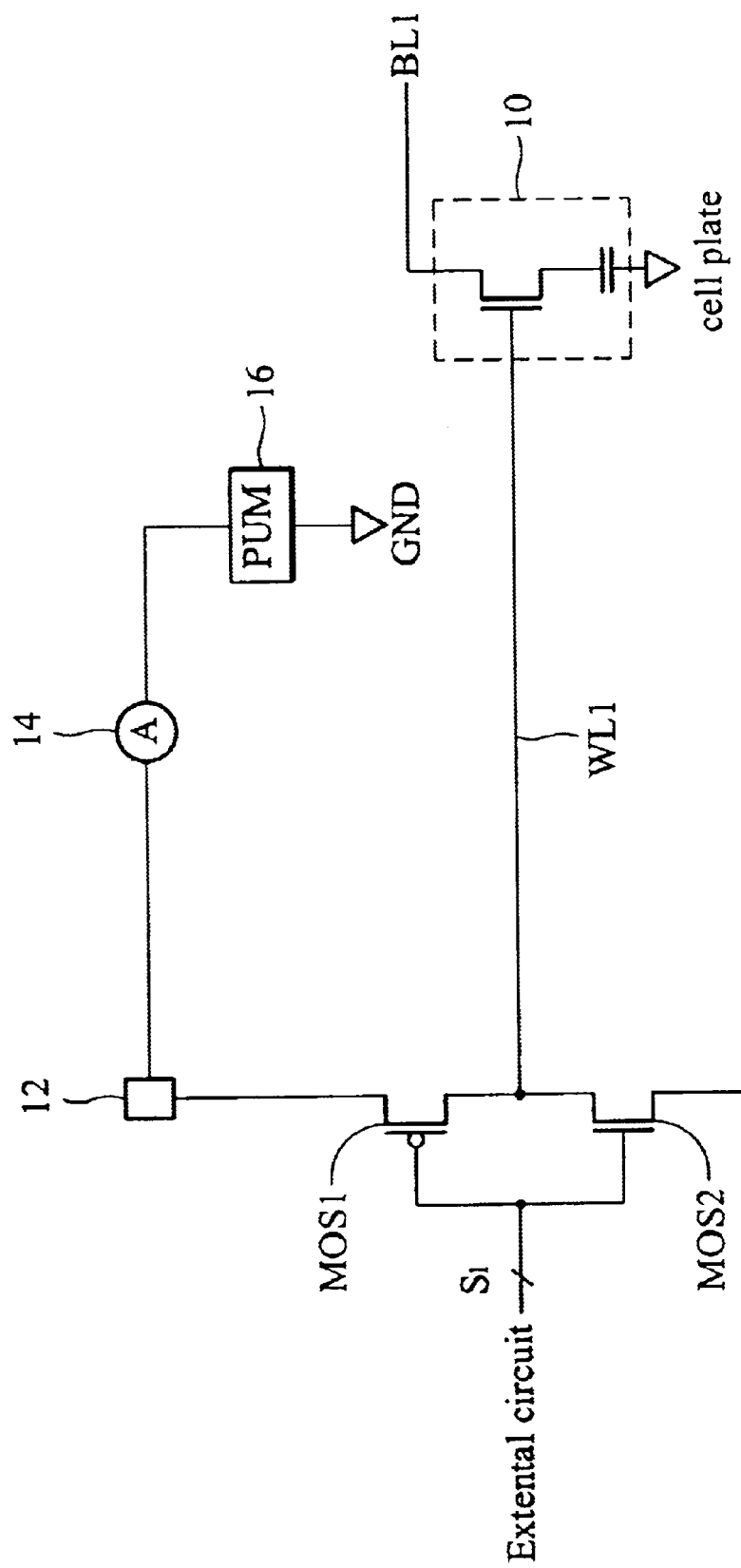
FIG. 1 is a schematic diagram illustrating the method of the present invention.

FIG. 1 is a schematic diagram illustrating the method of the present invention. Conventionally, defective word lines can be detected and memorized by a testing apparatus. In this case, the word line wL1 is assumed as a defective word line.

Figure 2:
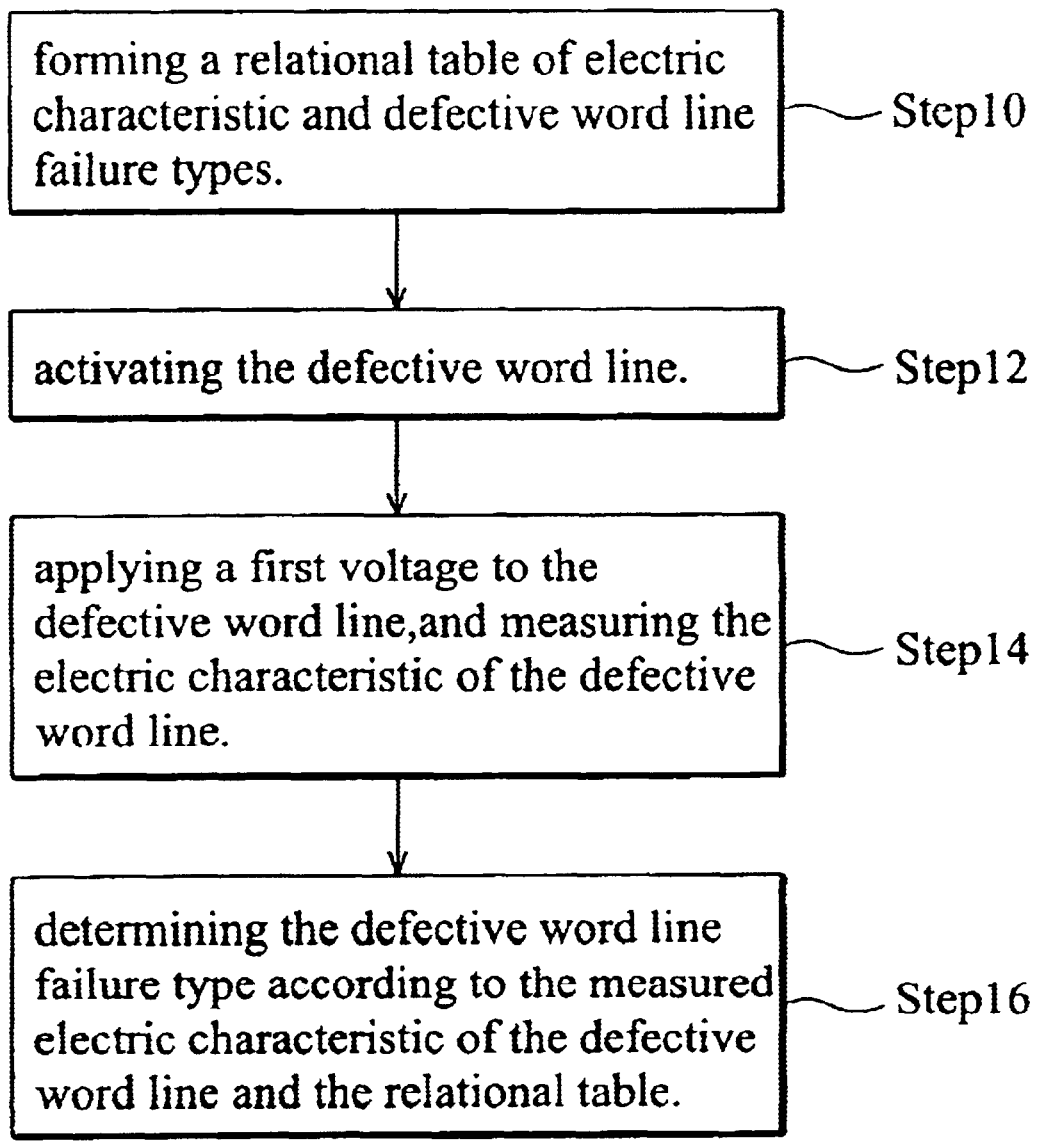
FIG. 2 shows a process flow of the first embodiment of the present invention.
Figure 3:
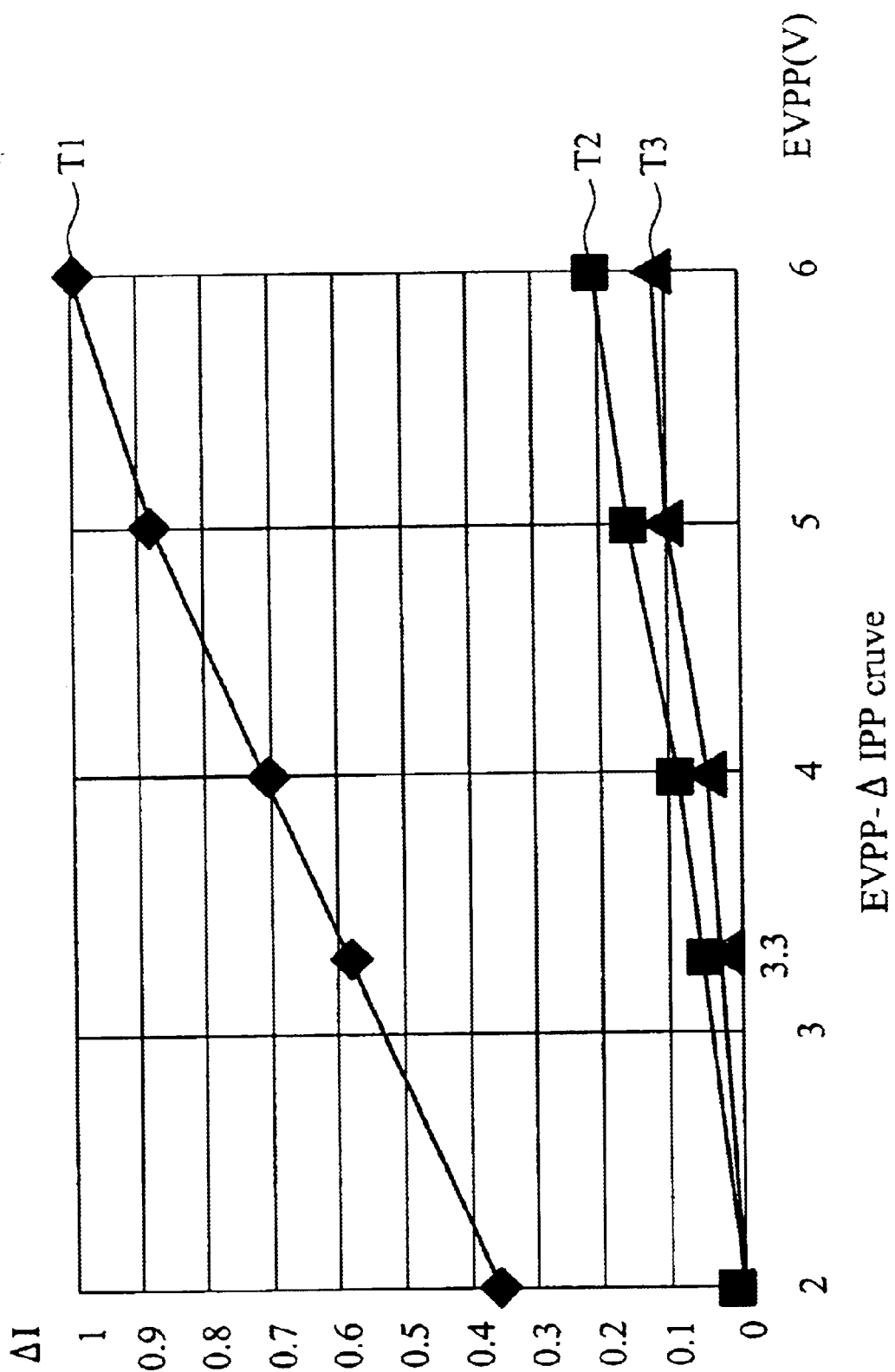
FIG. 3 is a schematic diagram illustrating the relational table of electric characteristic and the defective word line failure types.

FIG. 2 shows a process flow of the first embodiment of the present invention. First, in step S10, a relational table of electric characteristic and defective word line failure types is formed. The relational table is formed by measuring electric characteristics of several defective word lines with dissimilar failure types. For example, the failure type at least comprises a word line shorting to a bit line, a word line shorting to a word line and a word line shorting to the substrate due to pin holes in the gate oxide layer between the word line and the substrate. Furthermore, the electric characteristic of the word line may be voltage at the word line, current on the word line or resistance of the word line. In FIG. 3, current-voltage carves T1, T2 and T3 correspond to a word line shorting to a bit line strongly, a word line shorting to a bit line slightly, and a word line shorting to the substrate, respectively. In this case, the relational table of the electric characteristic and the defective word line failure type is formed according to the three failure types and the current-voltage carves T1~T3.

Next, in step S12, the defective word line WL1 is activated by an enable signal S1 from external circuit, for example a control circuit of a testing apparatus, as shown in FIG. 1. In this case of the present invention, the MOS transistor MOS1 is turned on according to the enable signal SI to activate the word line WL1.

Thereafter, in step S14, a first voltage is applied to the defective word line WL1 by a determining unit 16 of a testing apparatus. For example, the first voltage is a step voltage increasing from 0.01 volts to 7.0 volts. At the same time, the electric characteristic of the defective word line WL1 is measured using an electric characteristic measuring device. For example, the electric characteristic measuring device is a current meter 14 for measuring the current on the defective word line WL1 that the first voltage is applied to.

Last, in step 16, the defective word line failure type WL1 is determined by comparing the electric characteristic that the current meter 14 is measured when the first voltage is applied and the relational table of the electric characteristic and defective word line failure types. As shown in FIG. 3, for example, the defective word line failure type WL1 is a bit line shorting to a word line strongly (T1) when the first voltage applied to the defective word line WL is 6 volts and the measured current is first current. Alternatively, the defective word line failure type WL1 is a bit line shorting to a word line slightly (T2) when the first voltage applied to the defective word line WL is 6 volts and the measured current is second current. Alternatively, the defective word line failure type WL is a word line shorting to the substrate (T3) when the first voltage applied to the defective word line WL is 6 volts and the measured current is third current. In the case of the present embodiment, the first current is much larger than the second current and the third current, and the second current is larger than the third current. For example, the third current is 0.12 times the first current, and the third current is 0.6 times the second current.

Second Embodiment

Figure 4:
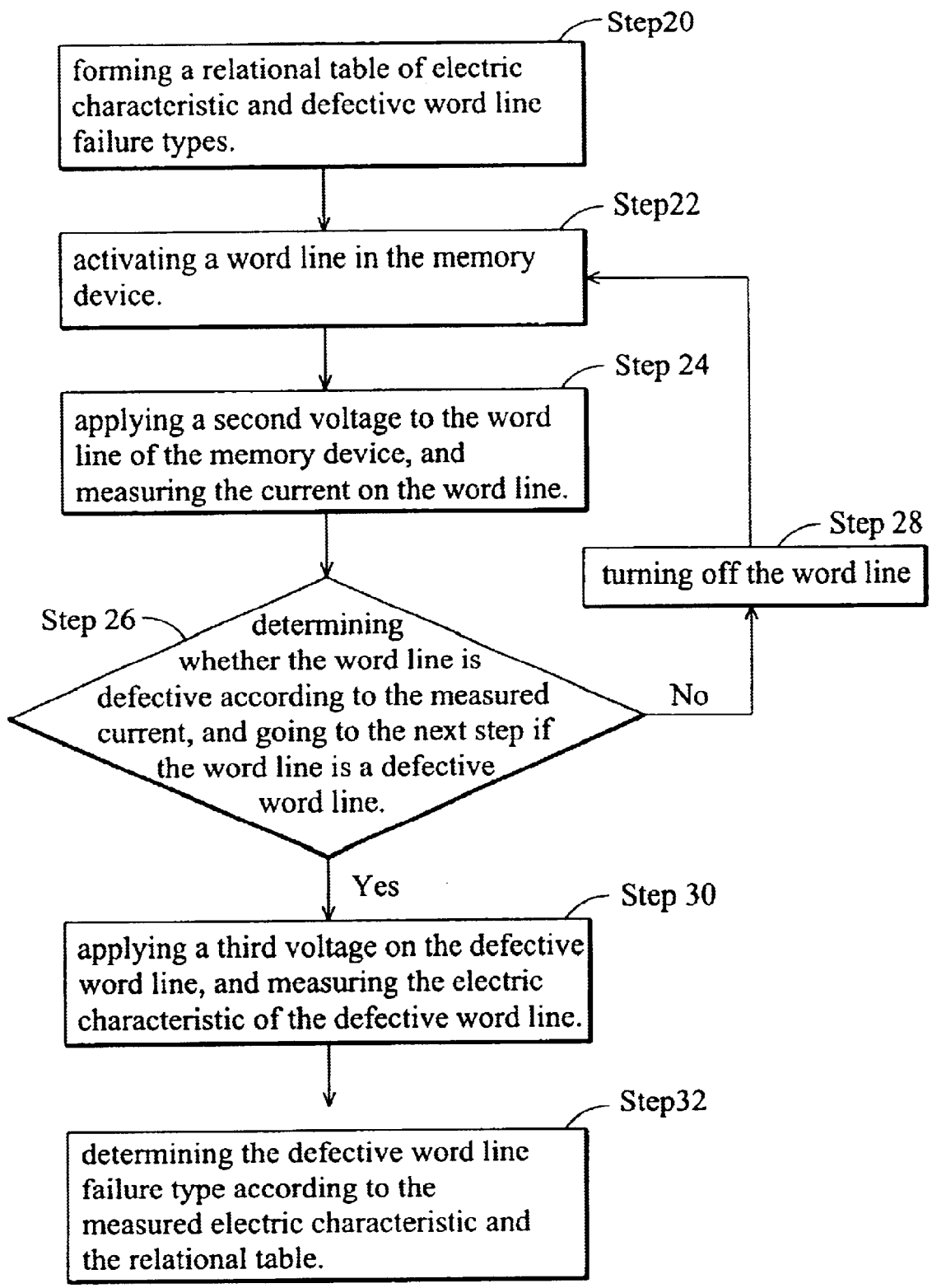
FIG. 4 shows a process flow of the second embodiment of the present invention.

FIG. 4 shows a process flow of the second embodiment of the present invention. First, in step S20, a relational table of electric characteristic and defective word line failure types is formed. The relational table is formed by measuring electric characteristic of several defective word lines with dissimilar failure type. For example, the failure type at least comprises a word line shorting to a bit line, a word line shorting to a word line and a word line shorting to the substrate due to pin holes in the gate oxide layer between the word line and the substrate. Furthermore, the electric characteristic of the word line may be voltage at the word line, current on the word line or resistance of the word line. In FIG. 3, current-voltage carves T1, T2 and T3 correspond to a word line shorting to a bit line strongly, a word line shorting to a bit line slightly, and a word line shorting to the substrate, respectively. In this case, the relational table of the electric characteristic and the defective word line failure type is formed according to the three failure types and the current-voltage carves T1~T3.

Next, in step S22, a word line WL1 in a memory device is activated by an enable signal S1 from external circuit, for example a control circuit of a testing apparatus, as shown in FIG. 1. In this case of the present invention, the MOS transistor MOS1 is turned on according to the enable signal S1 to activate the word line WL1.

Thereafter, in step S24, a second voltage is applied to the word line WL1 by a determining unit 16 of a testing apparatus. For example, the second voltage is a solid voltage with a determined level. At the same time, the current on the word line WL1 is measured using a current meter 14. Next, in step S26, whether the word line WL1 is defective is determined according to the measured current. The word line WL1 then is turned off when the word line WL1 is non-defective, in step S28. Another word line in the memory device then is activated to perform steps S24 and S26 to assess the presence of defects.

Thereafter, step S30 is performed if the word line WL1 is defective. In step S30, a third voltage is applied to the defective word line WL1 by a determining unit 16 of a testing apparatus. For example, the third voltage is a step voltage increasing from 0.01 volts to 7.0 volts. At the same time, the electric characteristic of the defective word line WL1 is measured using an electric characteristic measuring device. For example, the electric characteristic measuring device is a current meter 14 for measuring the current on the defective word line WL1 that the third voltage is applied to.

Next, in step S32, the defective word line failure type WL1 is determined by comparing the electric characteristic that the current meter 14 is measured when the third voltage is applied to and the relational table of the electric characteristic and defective word line failure types. As shown in FIG. 3, for example, the defective word line failure type WL1 is a bit line shorting to a word line strongly (T1) when the third voltage applied to the defective word line WL is 6 volts and the measured current is first current. Alternatively, the defective word line failure type WL1 is a bit line shorting to a word line slightly (T2) when the third voltage applied to the defective word line WL is 6 volts and the measured current is second current. Alternatively, the defective word line failure type WL is a word line shorting to the substrate (T3) when the third voltage applied to the defective word line WL is 6 volts and the measured current is third current. In this case of the embodiment of the present, the first current is much larger than the second current and the third current, and the second current is larger and the third current. For example, the third current is 0.12 times the first current, and the third current is 0.6 times the second current.

Step S28 is then performed, the defective word line WL1 is turned off. Another word line in the memory device is then activated to perform steps S24 and S26 to assess the presence of defects.

Consequently, the failure type of the detective word lines may be determined quickly in the present invention, thereby improving throughput.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of determining defective word line failure type in a memory device, comprising:

forming a relational table of electric characteristic and defective word line failure types;

activating the defective word line;

applying a step voltage to the defective word line, wherein voltage level of the step voltage increases;

measuring the electric characteristic of the defective word line; and determining the defective word line failure type according to the measured electric characteristic of the defective word line and the relational table.

2. The method as claimed in claim 1, wherein the electric characteristic is current.

3. The method as claimed in claim 1, wherein voltage level of the step voltage increases from 0.01 V to 7 V.

4. A method for determining word line failure type in a memory device, comprising:

(a) forming a relational table of electric characteristic and defective word line failure types;

(b) activating a word line in the memory device;

(c) applying a second voltage to the word line of the memory device, and measuring the current on the word line;

(d) determining whether the word line is defective according to the measured current, and going to the next step if the word line is a defective word line;

(e) applying a third voltage on the defective word line, and measuring the electric characteristic of the defective word line;

(f) determining the defective word line failure type according to the measured electric characteristic and the relational table;

(g) turning off the defective word line; and (h) activating another word line of the memory device and back to step (C).

5. The method as claimed in claim 4, wherein step (b) further comprises performing step (g) if the word line is non-defective.

6. The method as claimed in claim 5, wherein the third voltage is step voltage, and voltage level of step voltage increases.

7. The method as claimed in claim 5, wherein the third voltage is step voltage, and voltage level of step voltage increases from 0.01 V to 7 V.

8. The method as claimed in claim 5, wherein the second voltage is a solid voltage with a determined voltage level.

9. A method of determining defective word line failure type in a memory device, comprising:

forming a relational table of I-V curves and defective word line failure types; activating the defective word line;

applying a first voltage to the defective word line;

measuring an I-V curve of the defective word line; and determining the defective word line failure type according to the measured I-V curve of the defective word line and the relational table.

10. The method as claimed in claim 9, wherein the first voltage is a step voltage and voltage level of step voltage increases.

11. The method as claimed in claim 9, wherein the first voltage is a step voltage, and voltage level of step voltage increases from 0.01 V to 7 V.

* * * * *